United States Patent [19]

Moriizumi et al.

[11] Patent Number: 6,054,652
[45] Date of Patent: Apr. 25, 2000

[54] THIN-FILM MULTI-LAYER SUBSTRATE AND ELECTRONIC DEVICE

[75] Inventors: Kiyokazu Moriizumi; Shunichi Kikuchi; Kazuhiro Nitta; Naomi Fukunaga; Mitsuo Suehiro, all of Kawasaki, Japan

[73] Assignee: Fujitsu Limited, Kawasaki, Japan

[21] Appl. No.: 08/942,387

[22] Filed: Oct. 10, 1997

[30] Foreign Application Priority Data

Apr. 18, 1997 [JP] Japan ................................... 9-101955

[51] Int. Cl.[7] ............................. H01R 12/04; H01R 12/32
[52] U.S. Cl. ........................ 174/261; 174/267; 174/260; 361/773; 361/774
[58] Field of Search ..................................... 174/255, 260, 174/261, 266, 267, 250, 262, 263; 361/785, 790, 791, 771, 773, 779, 768, 760, 774, 735; 257/779, 781, 774, 780; 438/108, 109; 228/180.21, 180.22

[56] References Cited

U.S. PATENT DOCUMENTS

| 5,421,083 | 6/1995 | Suppelsa et al. | 29/852 |
|---|---|---|---|
| 5,432,675 | 7/1995 | Sorimachi et al. | 361/719 |
| 5,543,586 | 8/1996 | Crane, Jr. et al. | 174/262 |
| 5,834,705 | 11/1998 | Jonaidi | 174/261 |

FOREIGN PATENT DOCUMENTS

| 59-61054 | 4/1984 | Japan . |
|---|---|---|
| 63-182814 | 7/1988 | Japan . |
| 3-46297 | 2/1991 | Japan . |
| 3-46298 | 2/1991 | Japan . |
| 3-102895 | 4/1991 | Japan . |
| 3-178186 | 8/1991 | Japan . |
| 3-276797 | 12/1991 | Japan . |
| 5-283557 | 10/1993 | Japan . |
| 6-13755 | 1/1994 | Japan . |
| 6-37038 | 2/1994 | Japan . |
| 6-69281 | 3/1994 | Japan . |
| 6-219871 | 8/1994 | Japan . |
| 6-224193 | 8/1994 | Japan . |
| 7-45947 | 2/1995 | Japan . |
| 7-79078 | 3/1995 | Japan . |
| 7-86737 | 3/1995 | Japan . |
| 7-176864 | 7/1995 | Japan . |

*Primary Examiner*—Kristine Kincaid
*Assistant Examiner*—Jeremy Norris
*Attorney, Agent, or Firm*—Armstrong, Westerman, Hattori, McLeland and Naughton

[57] ABSTRACT

The thin-film multi-layer substrate includes an insulating substrate base plate, and a thin-film structure including a plurality of conducting layers and a plurality of insulating layers formed on the substrate base plate. A via structure is formed in the thin-film structure and connected to one of the conducting layers of the thin-layer structure. Pins are connected to the via structure, such that the bottom of the via structure is directly laminated on the substrate base plate, and the pins are secured onto the via structure.

6 Claims, 5 Drawing Sheets

THIN-FILM MULTI-LAYER SUBSTRATE AND ELECTRONIC DEVICE

BACKGROUND OF THE INVENTION

1. Field of the Invention

The present invention relates to a thin-film multi-layer substrate using pins as input/output terminals and to an electronic device.

2. Description of the Related Art

In recent years, thin-film multi-layer substrates have been used in devices and equipment which have small sizes and reduced weights and which employ LSIs of small sizes with many terminals. A thin-film multi-layer substrate has a thin-film structure including an insulating substrate base plate, a plurality of conducting layers and a plurality of insulating layers formed on the substrate base plate, and is suited for accomplishing fine-pitch wiring by mutually connecting the conducting layers by via structures (via holes).

An inorganic material such as alumina or mullite is used as material of a substrate base plate for a thin-film multi-layer substrate. It is also possible to use an organic material such as FR4 as the substrate base plate. The thin-film structure is obtained by laminating a conducting layer such as copper or aluminum and an insulating layer such as polyimide or epoxy, one on the other, the conducting layer being formed as a pattern for supplying electric power and for signal wiring, and the different conducting layers being connected together by via structures.

Pads are formed on the surface of the thin-film structure, and electronic parts such as LSI chips, resistors and capacitors are connected to the pads. Furthermore, the thin-film multi-layer substrate includes pins which form input/output terminals. Like the LSI chip, pins are connected to the pads on the surface of the thin-film structure. FIG. 5 of the attached drawings is a view illustrating a prior art for providing pins on the thin-film structure. In FIG. 5, a thin-film structure 114 on a substrate base plate 112 of a thin-film multi-layer substrate 110 comprises a plurality of conducting layers 118b to 118f and a plurality of insulating layers 120a to 120e. A pin 116 forming an input/output terminal is mounted on a pad 124 on the surface of the thin-film structure 114, and is connected to one of the conducting layers by a via structure 122. The via structure 122 is formed by removing the insulating layer on the surface of the thin-film structure 114 down to a conducting layer to which the connection is to be made. Under the via structure 122 are formed conducting layers 118e and 118f as signal wiring. Thus, the thin-film multi-layer substrate is used with electronic parts such as LSI and the like, as an electric device such as multi-chip module or the like. Such an electronic device is used by mounting it to a printed wiring board or to a motherboard by using pins serving as input/output terminals. The LSI chips and the input/output pins may be mounted to the same surface or to separate (both) surfaces.

Prior arts related to the thin-film multi-layer substrate have been disclosed in Japanese Unexamined Patent Publication (Kokai) No. 5-283557, No. 6-13755, No. 7-79078 and No. 7-86737. These prior arts, however, do not particularly serve as references for the present invention.

A pin serving as an input/output terminal is attached to a pad on the surface of the thin-film structure, and is connected to one of a plurality of conducting layers by a via structure provided in the thin-film structure. The pad on the surface of the thin-film structure has an area slightly larger than the area of the lower end of the pin, and the pin may be soldered on the pad. On the other hand, the via structure is a fine structure which is usually used for connecting the layers. When a wide area having a pad can be obtained on the surface of the thin-film structure, a multi-layer via structure can be formed to connect a plurality of layers. However, a via structure for connecting the surface of the thin-film structure to a desired conducting layer, is very finely constructed relative to the area of the pad, and a difference between the areas of the pad and the via structure is very large.

Under the pad are arranged not only the via structure but also the conducting layers and the insulating layers of the thin-film structure. Besides, the via structure extends only up to a conducting layer to which the connection is to be made. Under the conducting layer are arranged separate conducting layers, i.e., many signal wires via insulating layers.

When an electronic device including a thin-film multi-layer substrate is to be mounted to a printed wiring board or the like board, the other ends of the pins may be connected to the printed wiring board by soldering. In this case, the electronic device can be neither removed from the printed wiring board nor replaced unless the solder is melted. Nowadays, however, customers are using equipment very frequently, and it is desired that equipment can be repaired or components can be replaced by high-performance components within periods of time as short as possible. It is further desired that replacement can be done without requiring special tools or a particular technology.

For this purpose, a structure is desired in which an electronic device including a thin-film multi-layer substrate is mounted to a socket or to a connector instead of relying upon soldering. In this case, the conduction between the pin and the printed wiring board, which is based upon the contact of the socket with the pin, must be comparable to that accomplished by the soldering. Therefore, a force is imparted to the pin in an undesirable direction at all times, the force being greater by several tens of times than that when the connection is done by soldering. When the thin-film multi-layer substrate receives a load under high-temperature and high-humidity adverse environment, the adhesive force decreases on the interfaces among the insulating layers and the conducting layers as the insulating material absorbs moisture, and satisfactory strength is not reliably maintained for long periods of time. In the conventional thin-film multi-layer substrate, however, efforts have been preferentially made for obtaining fine multi-terminal wirings but not much consideration has been given to the strength of the pins and the via structure.

SUMMARY OF THE INVENTION

The object of the present invention is to provide a thin-film multi-layer substrate which can assure a sufficient strength of the portions where the pins used as input/output terminals are joined, and an electronic device including the thin-film multi-layer substrate.

A thin-film multi-layer substrate according to the present invention comprises an insulating substrate base plate, a thin-film structure including a plurality of conducting layers and a plurality of insulating layers formed on the substrate base plate, a via structure formed in the thin-film structure and connected to one of the conducting layers of said thin-layer structure, and pins connected to the via structure, wherein the bottom of the via structure is directly laminated on the substrate base plate and the pins are secured onto the via structure.

The electronic device according to the present invention includes the above-mentioned thin-film multi-layer substrate and at least one electronic member arranged on the surface of the thin-film structure.

In the above-mentioned arrangement, the via structure includes a plurality of conducting layers laminated on the substrate base plate, and the pins are supported with a rigidity equal to that of the pins when they are directly supported by the substrate base plate. Besides, there is no insulating layer in a portion of the via structure under the pin which is the input/output terminal. When the insulating layer comprises a hygroscopic material, the adhesive force decreases on the interfaces among the insulating layers and the conducting layers when a force is exerted from the pin to such a portion. According to the present invention, however, the portion to where a force will be exerted from the pin is free of interface between the insulating layer and the conducting layer. Therefore, the adhesive force does not decrease, and a sufficiently large strength is assured for extended periods of time. Thus, there are provided a thin-film multi-layer substrate and an electronic device having a sufficient strength even in an environment where pins are receiving force at all times.

The following features can be added to the above-mentioned arrangement.

The conducting layers of the via structure and the plurality of conducting layers of the thin-film structure are directly laminated one upon the other. In other words, the via structure includes no insulating layer.

The conducting layers of the via structure have areas equal to or larger than the areas of the ends of the pins.

The areas of the plurality of conducting layers of the via structure gradually increase from a conducting layer close to the substrate base plate toward a conducting layer away from the substrate base plate.

Among the conducting layers of the via structure, the conducting layer remotest from the substrate base plate is plated with nickel and gold.

The conducting layers of the thin-film structure are arranged on the outer side of the projected plane of the conducting layer remotest from the substrate base plate among the plurality of conducting layers of the via structure, except for the conducting layer of the via structure closest to the substrate base plate and the conducting layer of the thin-film substrate connected to the via structure.

One of the plurality of conducting layers of the thin-film structure connected to the via structure is connected to the via structure in the same layer without moving in a direction perpendicular to the thin-film structure on the projected plane of the conducting layer remotest from the substrate base plate among the plurality of conducting layers of the via structure.

Since the area gradually decreases from the pad to which the pin is connected to the lower via structure, stress does not build up in a concentrated manner in the via structure even in a state where thermal stress is produced at the time of joining the pins and where the force is exerted for holding the connector. Besides, under the pad, there is no material (insulating layer) of which the properties change greatly depending upon the humidity and, hence, the strength does not change very much depending upon the passage of time. Accordingly, even in an adverse environment where the temperature is high and the humidity is high, the strength for joining the pins is not deteriorated even after the passage of long periods of time, permitting the pins to be inserted into or removed from connectors. When it is desired to maintain a strong durability, the roots of the pins and the surfaces of the thin film after the pins are joined may be coated with a material which chiefly comprises an epoxy or silicon.

BRIEF DESCRIPTION OF THE DRAWINGS

The present invention will become more apparent from the following description of the preferred embodiments with reference to the accompanying drawings, in which.

DESCRIPTION OF THE PREFERRED EMBODIMENTS

Figure 3:
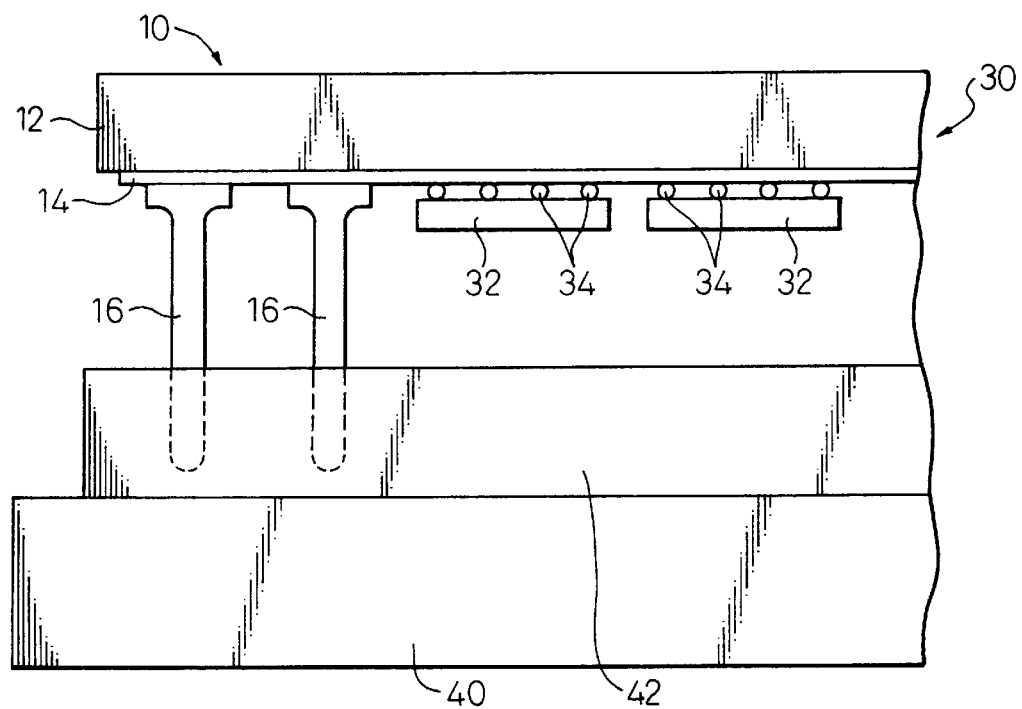
FIG. 3 is a diagrammatic view of an electronic device including the thin-film multi-layer substrate mounted to a mother board.

FIG. 3 is a view illustrating a thin-film multi-layer substrate 10 according to the present invention and an electronic device 30 including the thin-film multi-layer substrate 10. The thin-film multi-layer substrate 10 includes an insulating substrate base plate 12, a thin-film structure 14 formed on the substrate base plate 12, and pins 16 serving as input/output terminals. The electronic device 30 comprises the thin-film multi-layer substrate 10, electronic parts 32 such as LSIs mounted to the thin-film multi-layer substrate 10, resistors, capacitors and the like, and constitutes a multi-chip module. The electronic parts 32 are joined by, for example, solder bumps 34 to conducting layers (pads) on the surface of the thin-film multi-layer substrate 10.

The electronic device 30 can be mounted to a motherboard 40 of a computer. In this case, the pins 16 are inserted in the connector 42 of the motherboard 40 or in the through-holes of the printed board, so that signals are transmitted between the electronic device 30 and the computer through the pins 16.

Figure 4:
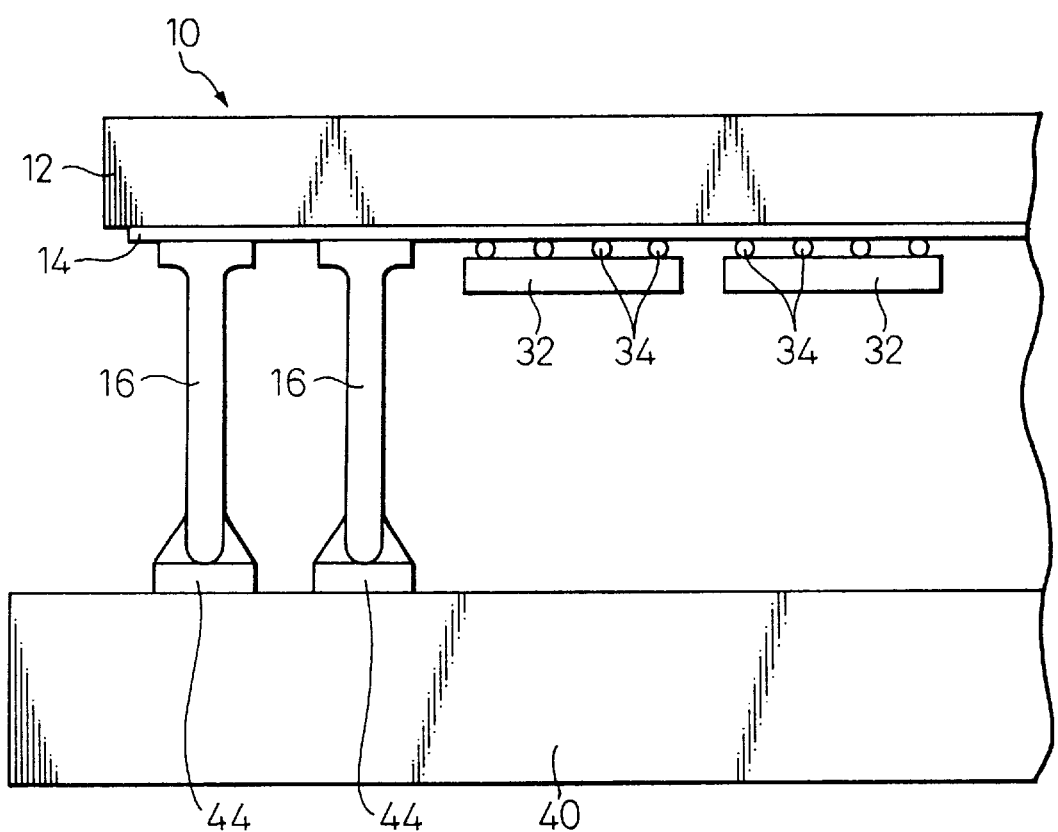
FIG. 4 is a diagrammatic view of another electronic device including the thin-film multi-layer substrate mounted to a mother board.
Figure 5:
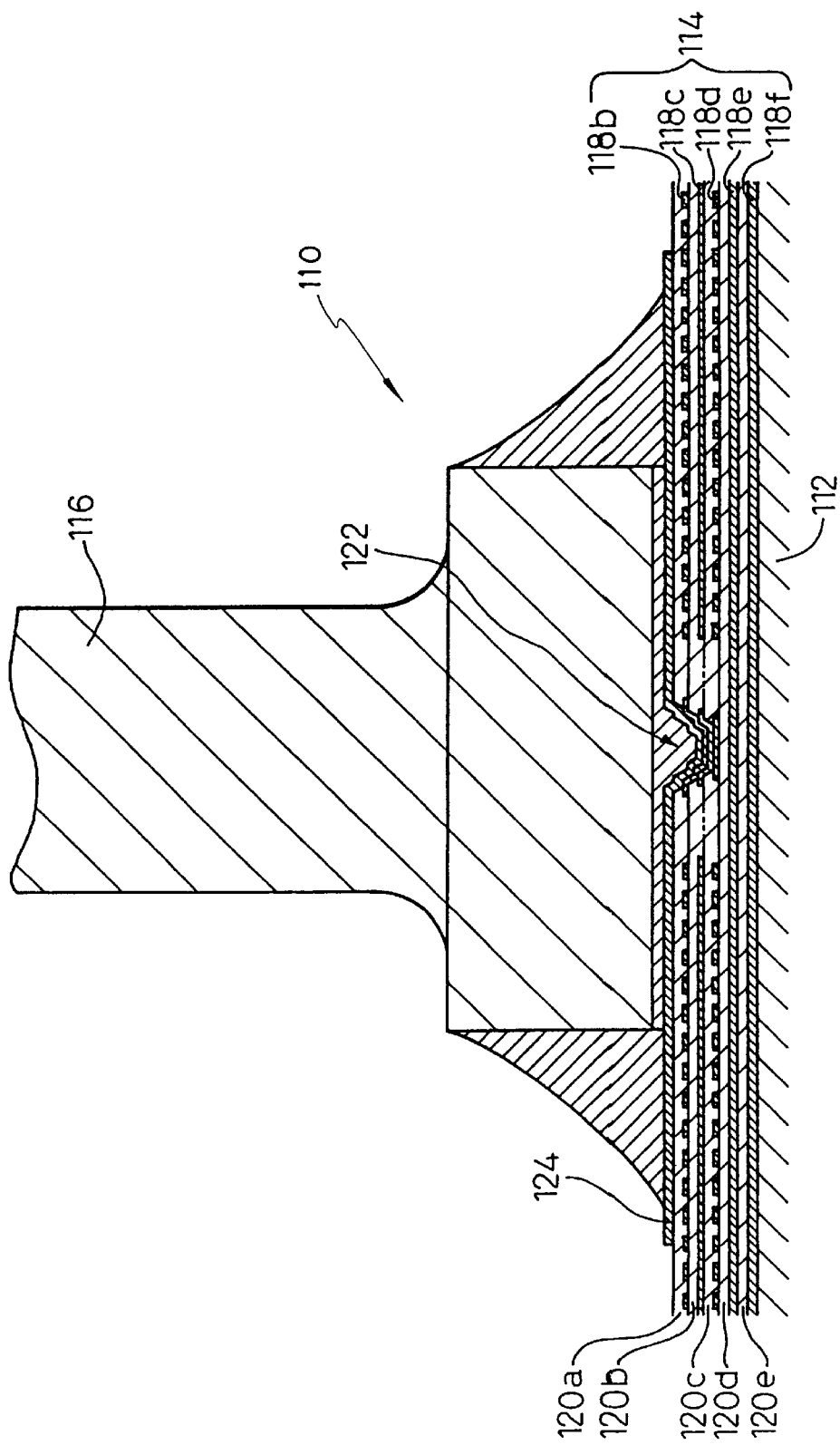
FIG. 5 is a view illustrating a prior art.

Referring to FIG. 4, furthermore, the pins 16 are soldered to the pads 44 of the mother board 40 whereby the signals are transmitted between the electronic device 30 and the computer via the pins 16. In either the constitution of FIG. 3 or the constitution of FIG. 4, load is exerted on the pins 16 and, hence, the thin-film structure 14 of the thin-film multi-layer substrate 10 tends to lose strength. The present invention solves this problem relying upon the constitution described below.

Figure 1:
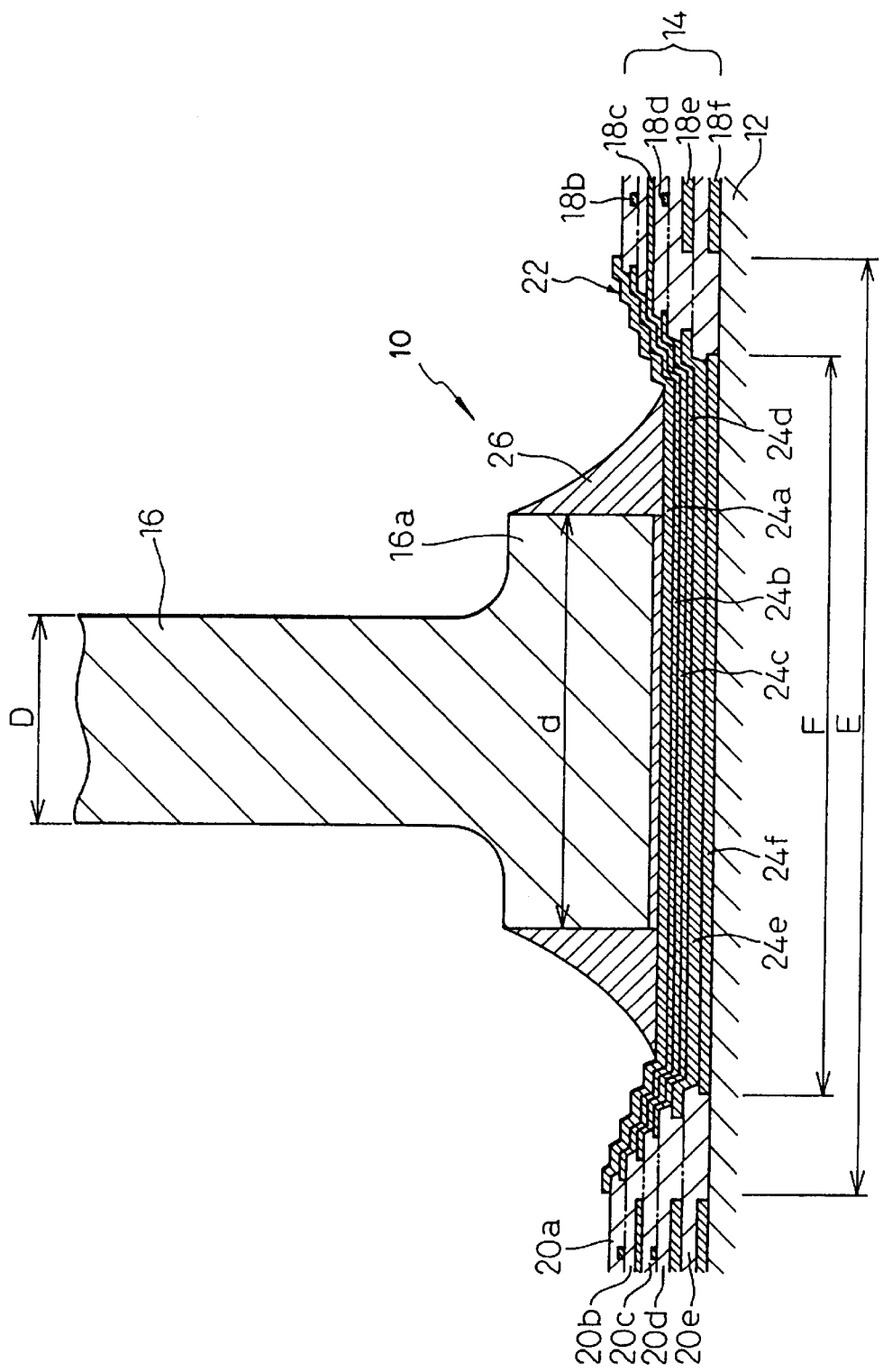
FIG. 1 is a cross-sectional view of a portion of a thin-film multi-layer substrate according to the first embodiment of the present invention.
Figure 2:
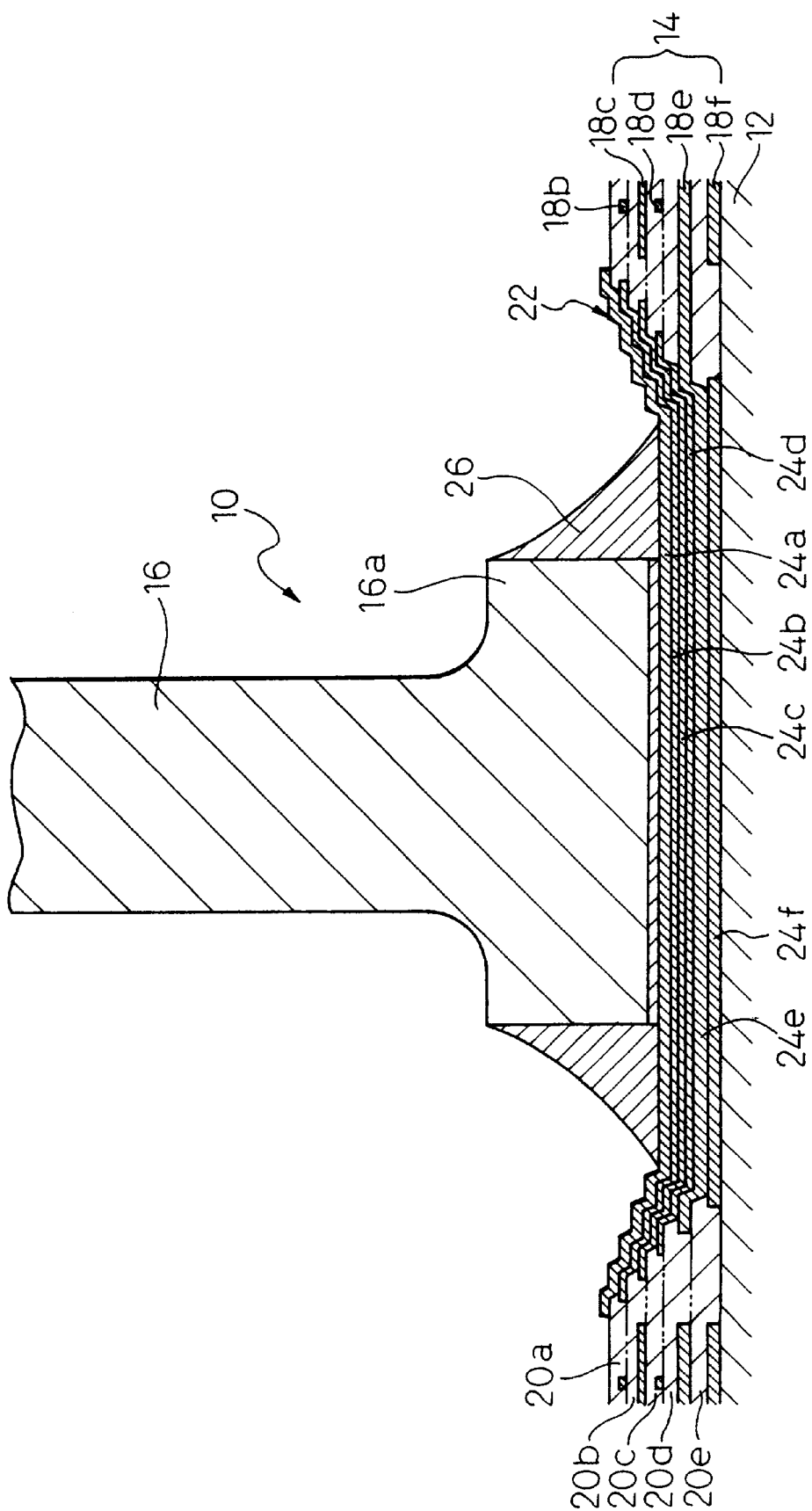
FIG. 2 is a cross-sectional view of a portion of a thin-film multi-layer substrate according to a second embodiment of the present invention.

Referring to FIGS. 1 and 2, the thin-film structure 14 of the thin-film multi-layer substrate 10 comprises a plurality of conducting layers 18b to 18f and a plurality of insulating layers 20a to 20e. The insulating layers 20a to 20e separate the adjacent two conducting layers 18b to 18f. The insulating layers 20a to 20e are continuous to each other at portions where there are no conducting layers 18b to 18f.

FIGS. 1 and 2 illustrate a portion where the pin 16 is provided but do not illustrate the portions, where electronic parts 32 are mounted, that are shown in FIGS. 3 and 4. On the uppermost insulating layer 20a is formed a top conducting layer (not shown in the figures) that serves as a pad for mounting the electronic part 32. The top conducting layer and the conducting layers 18b to 18f are formed as patterns for supplying electric power, for grounding and for forming signal wiring. In order to connect the patterns among the layers, the top conducting layer and the different conducting layers 18b to 18f are connected together by the via structure that penetrates through the insulating layers 20a to 20e.

As a material for the base plate 12 of the thin-film multi-layer substrate 10, there can be used an inorganic material such as alumina or mullite, or an organic material such as FR4. The top conducting layer and the conducting layers 18b to 18f are composed of a metal such as copper or aluminum, and the top conducting layer that serves as a pad is plated with nickel and gold to improve solder wettability. The insulating layers 20a to 20e are composed of a resin such as polyimide or epoxy.

The pin 16 is connected to one of the plurality of conducting layers 18b to 18f of the thin-film structure 14 relying on the via structure 22. In FIG. 1, the via structure 22 is connected to the conducting layer 18c of the thin-film structure 14. In FIG. 2, the via structure 22 is connected to the conducting layer 18e of the thin-film structure 14. The conducting layers 18b to 18f to which the connection is to be made become power feed terminals, ground terminals and signal terminals.

The via structure 22 comprises a plurality of conducting layers 24a to 24f laminated on the substrate base plate 12. The conducting layers 24a to 24f are formed simultaneously with the top conducting layer and the conducting layers 18b to 18f of the thin-film structure 14, and the conducting layer 24f on the bottom of the thin-film structure 14 is directly laminated on the substrate base plate 12. The via structure 22 is a stepped portion among the conducting layers 24a to 24f, and a central flat portion of the conducting layers 24a to 24f serve as a pad for mounting the pin 16. The via structure 22 is larger than the pad. The uppermost conducting layer 24a is plated with nickel and gold to improve solder wettability. The top conducting layer and the conducting layers 18b to 18f of the thin-film structure 14 are patterned by, for example, a photolithography process and are separated from the conducting layers 24a to 24f of the via structure 22.

Therefore, the plurality of conducting layers 24a to 24f of the via structure 22 are formed to correspond to the top conducting layer and the plurality of conducting layers 18b to 18f of the thin-film structure 14 simultaneously therewith, and are directly laminated one upon the other. In the via structure 22, no insulating layer is interposed between the uppermost conducting layer 24a and the substrate base plate 12.

The pin 16 has at its lower end a mounting seat 16a which is soldered as designated at 26 to the upper conducting layer 24a.

In the above-mentioned constitution, the via structure 22 is constituted by a plurality of conducting layers 24a to 24f directly laminated on the substrate base plate 12, and the pin 16 is supported assuring a rigidity equal to that when the pin 16 is directly supported by the substrate base plate 12. When the insulating layer is composed of a hygroscopic material, the adhesive force decreases on the interface between the insulating layer and the conducting layer upon receiving a force from the pin 16. According to the present invention, however, there is no insulating layer in the via structure 22 under the pin 16. Therefore, the adhesive force does not decrease, the strength for joining the pin is not deteriorated even under adverse conditions where the temperature is high and humidity is high, and a sufficient degree of strength is maintained for extended periods of time.

Even when a force is repetitively exerted on the pin 16, the strength of the thin-film multi-layer substrate 10 is not greatly deteriorated under the pin 16 even after the passage of time, making it possible to realize a structure for inserting or removing the pin 16 into or out of the connector 42 or the through-hole shown in FIG. 3. That is, when the pin 16 is to be inserted in, or removed from, the connector 42 or the through-hole, force is exerted on the pin 16 in the transverse direction. According to the present invention, however, a sufficient degree of durability is maintained even when a force is exerted on the pin 16 in the transverse direction. To realize a tough and durable structure, furthermore, the root portion of the pin 16 and the surface of the thin film, after the pin 16 has been soldered, may be coated with a material comprising chiefly an epoxy or silicon. There are thus provided a thin-film multi-layer substrate and an electronic device having a sufficient degree of strength even in an environment where the pins receive force at all times.

In this embodiment, furthermore, the areas of the plurality of conducting layers 24a to 24f of the via structure 22 are equal to, or larger than, the area of the mounting seat 16a at the lower end of the pin 16. When the pin 16 is to be soldered onto the uppermost conducting layer 24a, the tensile thermal stress becomes a problem at the time when the solder solidifies again. When the via structure has a small area, the tensile stress acts on the insulating layer; i.e., stress is concentrated in the insulating layer, such as polyimide, giving rise to the occurrence of cracks. When the via structure 22 has an area which is equal to, or larger than, the area of the mounting seat 16a of the lower end of the pin 16 as in this embodiment, the concentration of stress in the insulating layer can be reduced.

The conducting layers 24a to 24f of the via structure 22 have areas that gradually increase from the conducting layer 24f close to the substrate base plate 12 toward the conducting layer away from the substrate base plate 12. Therefore, stress does not concentrate in the via structure 22 even in a state where the thermal stress is exerted at the time of joining the pin 16 or the force is exerted for holding the connector. For instance, the pin 16 may have a diameter D of 0.2 mm, the mounting seat 16a of the pin 16 may have a diameter d of 0.4 mm, whereas the uppermost conducting layer (pad) 24a may have a diameter E of 0.9 mm and the lowermost conducting layer 24f may have a diameter F of 0.7 mm. Several thousand pins 16 are provided for each thin-film multi-layer substrate 10.

Furthermore, the conductor layers 18b to 18f of the thin-film structure 12 are arranged on the outer side of the projected plane of the conducting layer 24a most remote from the substrate base plate 12 among the conducting layers 24a to 24f of the via structure 22, except for the conducting layer 24f of the via structure 22 closest to the substrate base plate 12 and the conducting layer connected to the via structure 22. That is, under the uppermost conducting layer 24a that serves as the pad, there are arranged only that wiring to which the connection is to be made, so that there exists no interface between the insulating layer and the conducting layer in a range on where the force from the pin 16 may be exerted, in order to minimize the concentration of stress.

One of the conducting layers 18b to 18f of the thin-film structure 14 connected to the via structure 22, is connected to the via structure 22 in the same layer without moving in a direction perpendicular to the thin-film structure 22 on a projected plane of the conducting layer 24a remotest from the substrate base plate 12 among the plurality of conducting layers 24a to 24f of the via structure 22. That is, transfer of signals is inhibited near the via structure 22 thereby to avoid concentration of stress in the pattern.

According to the present invention, as described above, there are provided a thin-film multi-layer substrate and an electronic device, having pins connected onto the thin-film structure, that are capable of withstanding a high-temperature and high-humidity environment.

What is claimed is:

1. A thin-film multi-layer substrate comprising an insulating substrate base plate, a thin-film structure including a plurality of conducting layers and a plurality of insulating layers formed on said substrate base plate, a via structure formed in said thin-film structure and connected to one of the conducting layers of said thin-film structure, and pins connected to said via structure, said via structure having a plurality of conducting layers corresponding to the conducting layers of said thin-film structure, said conducting layers of said via structure being directly laminated one on another, the bottom of said via structure being directly laminated on said substrate base plate, said pins being secured onto said via structure, wherein each of the conducting layers of said via structure has an area equal to or larger than an area of the end of one of said pins.

2. A thin-film multi-layer substrate according to claim 1, wherein the areas of the conducting layers of said via structure increase in the order from the conducting layer closest to the substrate base plate toward the conducting layer most remote from said substrate base plate.

3. A thin-film multi-layer substrate according to claim 2, wherein the conducting layer in the conducting layers of said via structure most remote from said substrate base plate is plated with nickel and gold.

4. A thin-film multi-layer substrate according to claim 2, wherein the conducting layers of said thin-film structure are arranged outside an area defined by the projection of the periphery of the conducting layer of said via structure most remote from said substrate base plate among the conducting layers of said via structure, except for the conducting layer of said via structure closest to the substrate base plate and the conducting layer of said thin-film structure connected to said via structure.

5. A thin-film multi-layer substrate according to claim 2, wherein one of the conducting layers of said thin-film structure connected to said via structure is connected to the via structure without being bent in a direction perpendicular to the thin-film structure inside an area defined by a projection of the periphery of the conducting layer of said via structure most remote from said substrate base plate among the conducting layers of said via structure.

6. An electronic device comprising an insulating substrate base plate, a thin-film structure including a plurality of conducting layers and a plurality of insulating layers formed on said substrate base plate, at least one electronic member arranged on the surface of said thin-film structure, a via structure formed in said thin-film structure and connected to one of said conducting layers, and pins connected to said via structure, wherein said via structure is constituted by a plurality of conducting layers laminated on said substrate base plate, the conducting layers of said via structure corresponding to the conducting layers of said thin-film structure, and the conducting layers of said via structure being directly laminated one on another, each of the conducting layers of said via structure having an area equal to or larger than an area of the end of one of said pins.

* * * * *